United States Patent
Ni

(10) Patent No.: US 7,629,803 B1
(45) Date of Patent: Dec. 8, 2009

(54) PROBE CARD ASSEMBLY AND TEST PROBES THEREIN

(75) Inventor: Cheng-Chin Ni, Hsin-Chu (TW)

(73) Assignee: King Yuan Electronics Co., Ltd, Hsin-Chu (TW)

( * ) Notice: Subject to any disclaimer, the term of this patent is extended or adjusted under 35 U.S.C. 154(b) by 0 days.

(21) Appl. No.: 12/199,828

(22) Filed: Aug. 28, 2008

(30) Foreign Application Priority Data

Jun. 19, 2008 (TW) .............................. 97122940 A

(51) Int. Cl.
*G01R 31/02* (2006.01)
(52) U.S. Cl. ...................................... 324/754; 324/762
(58) Field of Classification Search ........................ None
See application file for complete search history.

(56) References Cited

U.S. PATENT DOCUMENTS

| 5,670,889 | A | 9/1997 | Okubo et al. |
| 6,137,297 | A | 10/2000 | McNair et al. |
| 6,478,596 | B2 | 11/2002 | Yoshida et al. |
| 6,515,358 | B1 | 2/2003 | Dass et al. |
| 7,053,638 | B2 | 5/2006 | Hsu et al. |
| 7,271,603 | B2 | 9/2007 | Gleason et al. |
| 7,304,488 | B2 | 12/2007 | Gleason et al. |
| 7,451,646 | B2 * | 11/2008 | Cleland et al. ........... 73/335.04 |

* cited by examiner

*Primary Examiner*—Minh N Tang
(74) *Attorney, Agent, or Firm*—Ming Chow; Sinorica, LLC

(57) ABSTRACT

Disclosed are a probe card assembly and test probes used therein. The probe card assembly includes a main body, a probe base provided at a center of the main body, and a plurality of test probes connecting the main body and the probe base. Therein, each of the test probes has a tip extending out from the probe base for contacting and testing a wafer. The test probes include at least one power probe, at least one grounding probe and a plurality of signal probes, wherein each of the test probes has a middle section between the main body and contains therein a core that is wrapped by an insulation layer.

19 Claims, 5 Drawing Sheets

PROBE CARD ASSEMBLY AND TEST PROBES THEREIN

BACKGROUND OF THE INVENTION

1. Technical Field

The present invention relates to a probe card assembly and test probes used therein. More particularly, the present invention relates to a probe card assembly and test probes therein for testing semiconductor wafers.

2. Description of Related Art

In a process for manufacturing semiconductor wafers, test equipments and probe cards are typically used for testing dies on the wafers. Some prior arts, such as U.S. Pat. Nos. 7,053,638, 6,515,358, 6,137,297, 5,670,889, 7,271,603, 7,304,488 and 6,478,596, have proposed related approaches. A probe card has precise contacting means for contacting and electrifying each die on a wafer to test the dies and thereby ensure that the wafer is fabricated with electrical properties and performances answering to its design specifications. In recent years, the development of test equipments and probe cards tend toward high-frequency properties to adapt to the emerging semiconductor apparatuses capable of high-speed operation. However, when a traditional cantilever probe card having closely arranged test probes is used in high-frequency tests, noises brought by electromagnetic interference between the test probes can significantly affect the consistency of test results and additional repeated tests may be required, resulting in reduced productivity and testing efficiency. Hence, a need exists for a structural improvement in the traditional probe card to remedy the problem of the prior arts.

SUMMARY OF THE INVENTION

In an attempt to overcome the defects of the prior arts, the present invention provides a probe card assembly and test probes therein. The probe card assembly comprises a main body, a probe base provided at a center of the main body, and a plurality of test probes connecting the main body and the probe base. Therein, each of the test probes has a tip extending out from the probe base for contacting and testing a wafer. Besides, the test probes comprise at least one power probe, at least one grounding probe and a plurality of signal probes, wherein each of the test probes has a middle section between the main body and the probe base and contains therein a core that is wrapped by an insulation layer. Therein, at least one of the test probes other than the grounding probe has an outer surface of its middle section wound by at least one conductive wire whose two ends are connected with a grounding end of the main body of the probe card assembly. The conductive wire winding on the test probe has a length $L_1$ and a wound part of the middle section has a length $L_2$ while the insulation layer at the middle section of the test probe has an outer diameter $D_1$, wherein for the probe card assembly to smoothly transmit high-frequency signals, it is preferred that $L_1$, $L_2$ and $D_1$ are in a relation shown by the formula below:

$$L_1 \geq L_2 + 3.14 D_1.$$

Thus, a main objective of the present invention is to provide a probe card assembly for testing wafers with enhanced accuracy in high-frequency tests.

Another objective of the present invention is to provide a probe card assembly for testing wafers with significantly reduced noises during high-frequency tests.

Another objective of the present invention is to provide a probe card assembly for testing wafers, wherein inductance between a power probe and a grounding probe of the probe card assembly can be effectively reduced.

Another objective of the present invention is to provide test probes used in a probe card assembly for testing wafers with enhanced accuracy in high-frequency tests.

Still another objective of the present invention is to provide test probes used in a probe card assembly for testing wafers with significantly reduced noises during high-frequency tests.

Yet another objective of the present invention is to provide test probes used in a probe card assembly for testing wafers, wherein inductance between a power probe and a grounding probe of the probe card assembly can be effectively reduced.

BRIEF DESCRIPTION OF THE DRAWINGS

The invention as well as a preferred mode of use, further objectives and advantages thereof will best be understood by reference to the following detailed description of illustrative embodiments when read in conjunction with the accompanying drawings, wherein.

DETAILED DESCRIPTION OF THE PREFERRED EMBODIMENTS

The present invention provides a probe card assembly and test probes used therein. Since the operational principles and basic functions of the probe card assembly are well known by people of ordinary skill in the art, a detailed description of such principles and functions will be omitted herein. Meantime, the accompanying drawings to which the following description refers are intended to illustrate structural features of the present invention only schematically and therefore are not, and need not be, drawn to scale.

Figure 1:
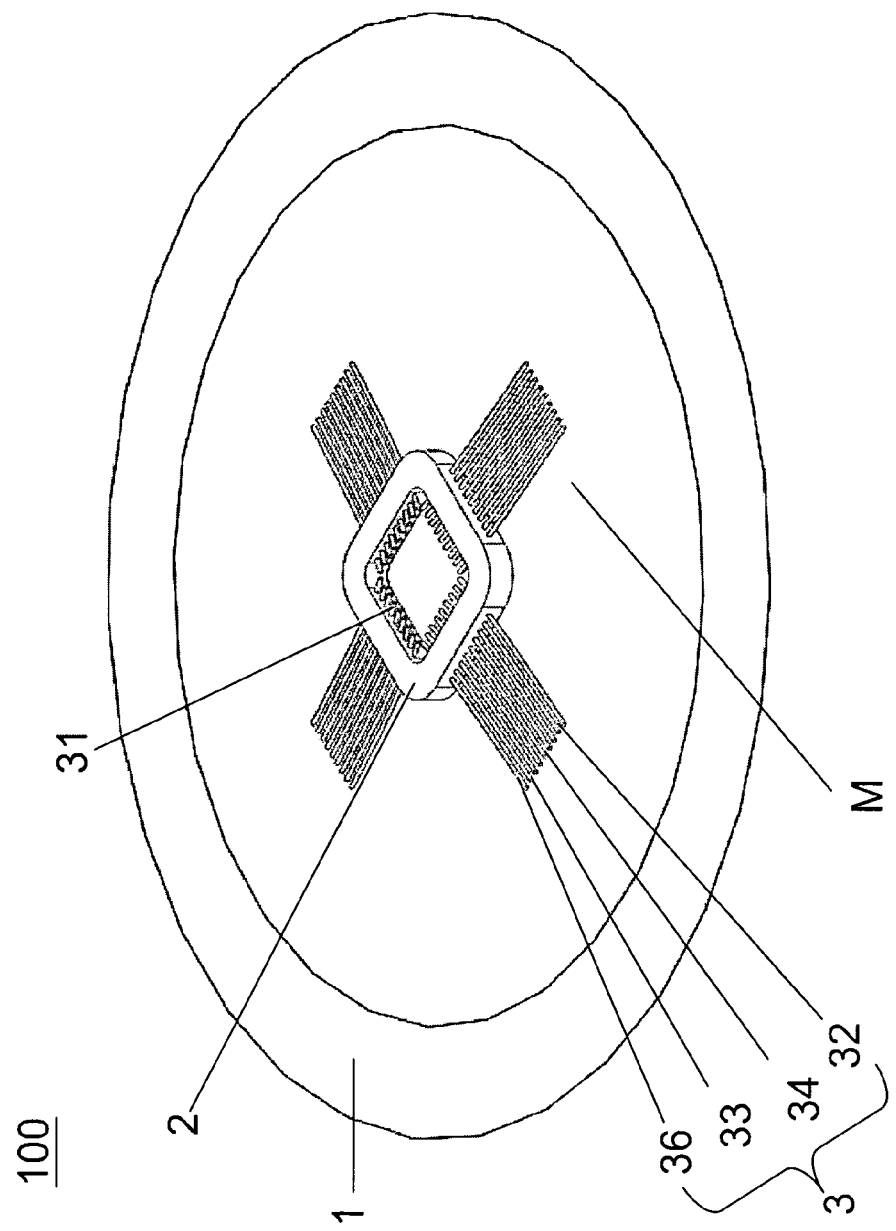
FIG. 1 is a schematic drawing of a probe card assembly according to the present invention.
Figure 2:
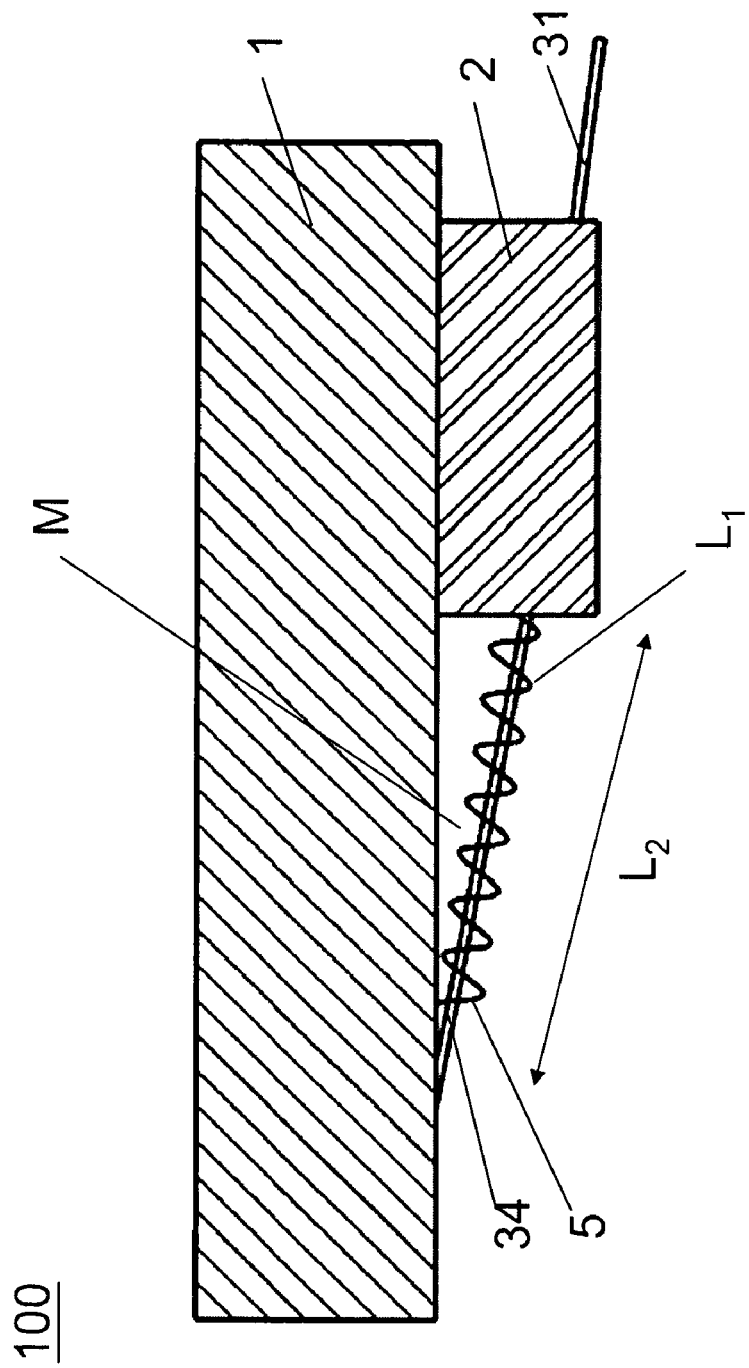
FIG. 2 is a partial, cross-sectional view of the probe card assembly according to the present invention.
Figure 3:
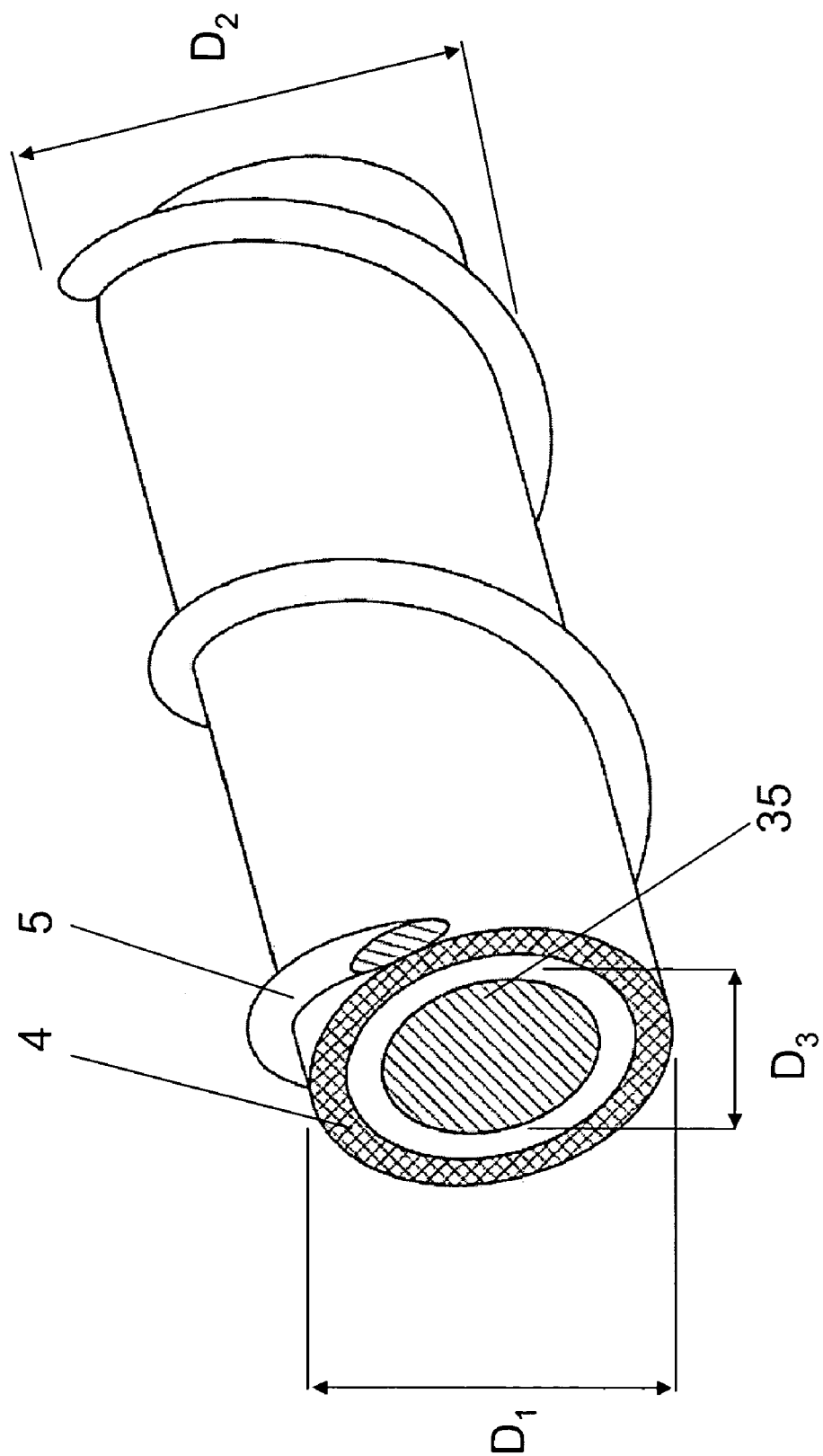
FIG. 3 is a cross-sectional view of a test probe according to the present invention.

Please refer to FIGS. 1 through 3 for a probe card assembly 100 according to a first preferred embodiment of the present invention. The probe card assembly 100 primarily comprises a main body 1, a probe base 2 provided at a center of the main body 1, and a plurality of test probes 3 connecting the main body 1 and the probe base 2. The test probes 3 comprise at least one power probe 32, at least one grounding probe 33 and a plurality of signal probes 34. Each of the test probes 3 has a middle section M between the main body 1 and the probe base 2, as well as a tip 31 extending out from the probe base 2 for contacting a wafer (not shown) and testing electrical properties thereof. Besides, each of the test probes 3 further contains therein a core 35 that is wrapped by an insulation layer 4.

In view that the closely arranged test probes 3 tend to suffer from mutual signal interference and excessive inductance, according to the present embodiment of the present invention, an outer surface of the middle section M of at least one of the test probes other than the grounding probe 33 is wound by at least one conductive wire 5. Two ends of the conductive wire 5 are connected to a grounding end of the main body 1, namely connected to a grounding layer in a PCB of the main body 1. Taking the signal probe 34 depicted in FIG. 2 for example, the conductive wire 5 winding on the signal probe 34 has a length $L_1$ and a part of the middle section M of the signal probe 34 wound by the conductive wire 5 has a length $L_2$ while the insulation layer 4 at the middle section M of the signal probe 34 has an outer diameter $D_1$. The $L_1$, $L_2$ and $D_1$ are preferably in a relation shown by the formula: $L_1 \geq L_2 + 3.14\ D_1$. In other words, the conductive wire 5 preferably encircles the middle section M of the test probe 3 with at least one circle, so that related high-frequency noises can be led to the grounding end through the conductive wire 5, thereby reducing inductance. As signals on the test probes 3 are secured from loss and interference, the test probes 3 are enabled to transmit high-frequency signals smoothly and perform high-frequency tests successfully.

Figure 4:
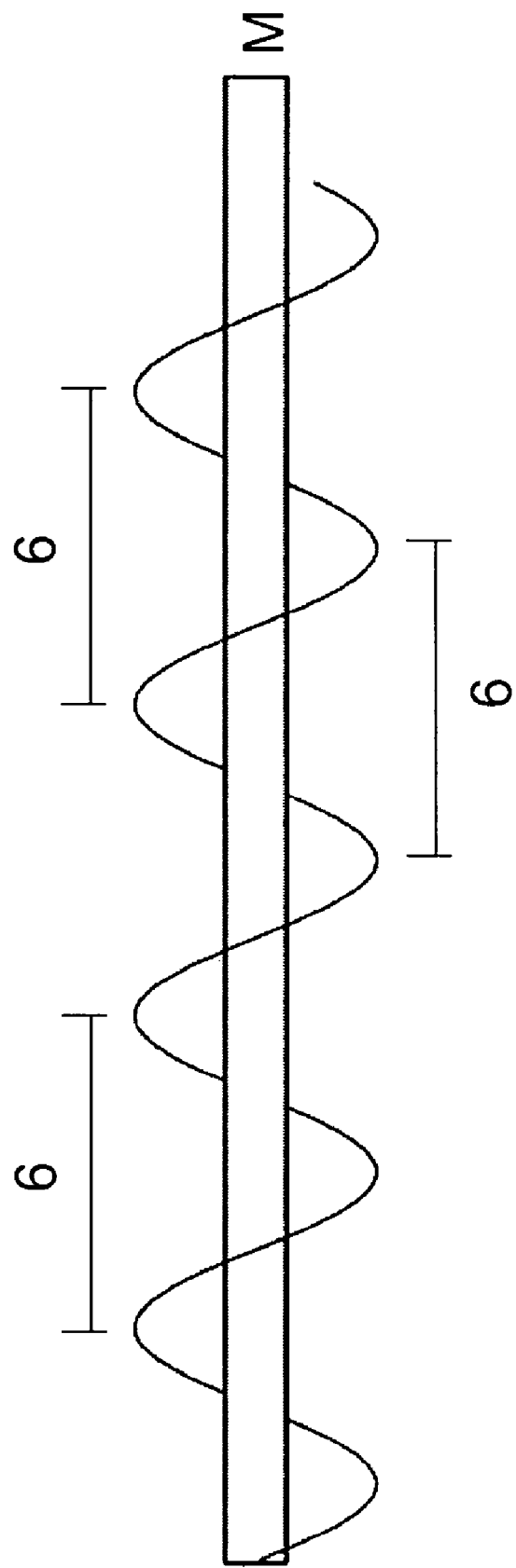
FIG. 4 is a schematic drawing showing a conductive wire winding the test probe of the present invention at identical pitches.
Figure 5:
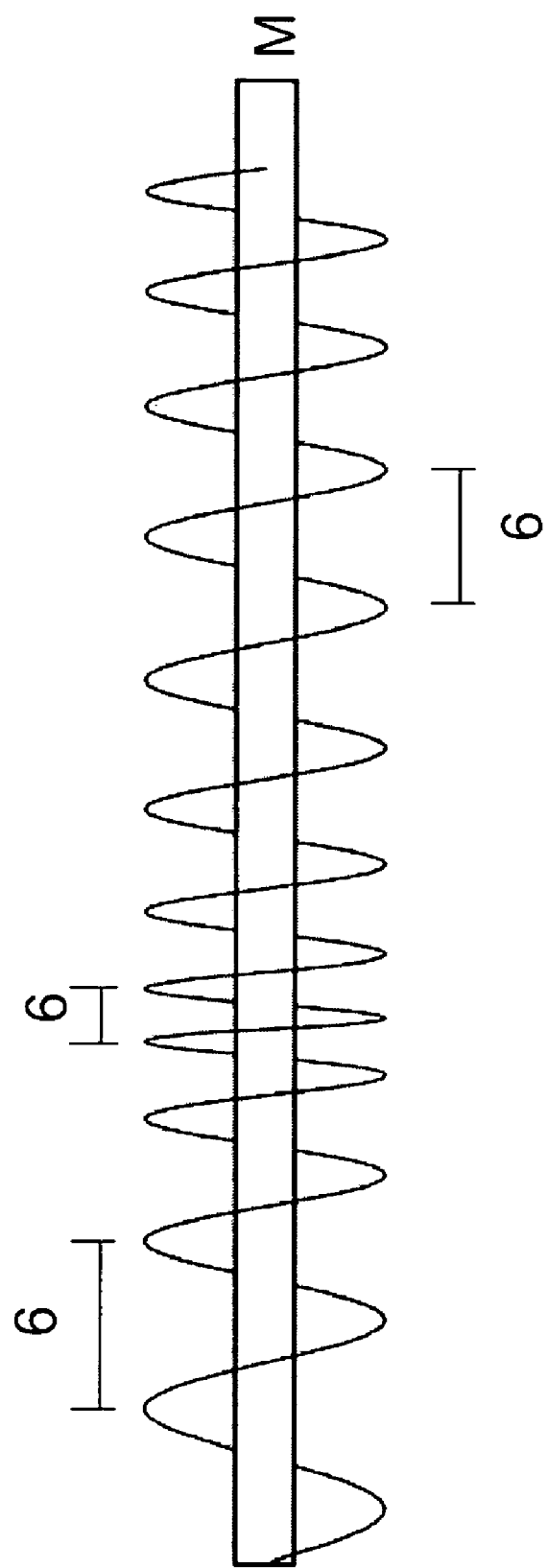
FIG. 5 is another schematic drawing showing the conductive wire winding the test probe of the present invention at different pitches.

It is understood that the conductive wire 5 in the aforementioned embodiment can be implemented in a different number. That is, the test probe(s) 3 may be wound by a plurality of said conductive wires 5. Meanwhile, the conductive wire 5 may encircle the test probe(s) 3 with more than one circle. In addition, pitches 6 between the circles of the conductive wires 5 may be identical, as shown in FIG. 4, or may be different, as shown in FIG. 5. Therein, the identical pitches are easier to make and are therefore preferred.

Since signal interference is mostly attributed to high-frequency noises, better effects can be attained when the conductive wire 5 is wound on high-frequency signal test probes 36 than on the normal signal probes 34.

Typically, the power probe 32 and the grounding probe 33 are located at two sides of the signal probes 34. Since the power probe 32 transmits greater electric currents than the signal probes 34 do, the conductive wire 5 can be wound on the power probe 32 to achieve enhanced noise-eliminating effects with a simplified configuration, thereby significantly reducing inductance between the power probe 32 and the grounding probe 33 and stabilizing testing signals on the test probes.

Please refer to FIGS. 1 through 3 again for a second preferred embodiment of the present invention. Therein, a probe card assembly 100 primarily comprises a main body 1, a probe base 2 provided at a center of the main body 1, and a plurality of test probes 3 connecting the main body 1 and the probe base 2. The test probes 3 comprise at least one power probe 32, at least one grounding probe 33 and a plurality of signal probes 34. Each of the test probes 3 has a middle section M between the main body 1 and the probe base 2, as well as a tip 31 extending out from the probe base 2 for contacting a wafer (not shown) and testing electrical properties thereof. Besides, each of the test probes 3 further contains therein a core 35 that is wrapped by an insulation layer 4.

Seeing the problem that an undue distance between the test probes 3 and a grounding end of the main body 1 incurs increased inductance that causes uncontrollable characteristic impedance, in the present embodiment, an outer surface of the middle section M of at least one said test probe 3 other than the grounding probe 33 is wound by at least one conductive wire 5 whose two ends are connected with the grounding end of the main body 1, namely a grounding layer in a PCB of the main body 1. Taking the signal probe 34 depicted in FIG. 3 for example, a diameter of circles formed by the conductive wire 5 winding on the signal probe 34 is $D_2$, a diameter of the core 35 is $D_3$, and a characteristic impedance of the signal probe 34 is E. $D_2$, $D_3$ and E are preferably in a relation shown by the formula: $20*D_2/D_3 \leq E \leq 25*D_2/D_3$, so that the probe card assembly can transmit high-frequency signals successfully. According to the above formula, when the demand of the characteristic impedance E is approximately 50 ohm, the value of $D_2/D_3$ can be set at 2.2. Thus, when it is necessary to set the characteristic impedance E at 75 or 100 ohms or any other impedance value so as to match the probe card assembly 100, corresponding settings can be easily accomplished by setting the value of $D_2/D_3$.

It is understood that, as in the case with the first preferred embodiment, the conductive wire 5 in the present embodiment can be implemented in a different number. That is, the test probe(s) 3 may be wound by a plurality of said conductive wires 5. Meanwhile, the conductive wire 5 may encircle the test probe(s) 3 with more than one circle. In addition, pitches 6 between the circles of the conductive wires 5 may be identical, as shown in FIG. 4, or may be different, as shown in FIG. 5. Therein, the identical pitches are easier to make and are therefore preferred. Since signal interference is mostly attributed to high-frequency noises, better effects can be attained when the conductive wire 5 is wound on high-frequency signal probes 36 than on the normal signal probes 34. Typically, the power probe 32 and the grounding probe 33 are located at two sides of the signal probes 34. Since the power probe 32 transmits greater electric currents than the signal probes 34 do, the conductive wire 5 can be wound on the power probe 32 to achieve enhanced noise-eliminating effects with a simplified configuration, thereby significantly reducing inductance between the power probe 32 and the grounding probe 33 and stabilizing testing signals on the test probes.

The present invention further provides test probes 3 used in a probe card assembly 100 as a third preferred embodiment. Therein, the probe card assembly 100 primarily comprises a main body 1, a probe base 2 provided at a center of the main body 1, and a plurality of said test probes 3 connecting the main body 1 and the probe base 2. Characteristics of the test probes 3 in the present embodiment are the same as those of the test probes 3 in the first preferred embodiment.

The present invention further provides test probes 3 used in a probe card assembly 100 as a third preferred embodiment. Therein, the probe card assembly 100 primarily comprises a main body 1, a probe base 2 provided at a center of the main body 1, and a plurality of said test probes 3 connecting the main body 1 and the probe base 2. Characteristics of the test probes 3 in the present embodiment are the same as those of the test probes 3 in the second preferred embodiment.

The present invention has been described with reference to preferred embodiments thereof and it is understood that the embodiments are not intended to limit the scope of the present invention. Moreover, as the contents disclosed herein should be readily understood and can be implemented by a person skilled in the art, all equivalent changes or modifications which do not depart from the spirit of the present invention should be encompassed by the appended claims.

What is claimed is:

1. A probe card assembly, comprising a main body, a probe base provided at a center of the main body, and a plurality of test probes connecting the main body and the probe base, wherein each of the test probes has a tip extending out from the probe base for contacting a wafer to be tested, and the test probes comprise at least one power probe, at least one grounding probe and a plurality of signal probes, in which each of the test probes has a middle section between the main body and the probe base and contains therein a core that is wrapped by an insulation layer, the probe card assembly being characterized in that:

at least one of the test probes other than the grounding probe has an outer surface of the middle section thereof wound by at least one conductive wire whose two ends are connected to a grounding end of the main body of the probe card assembly, wherein a length $L_1$ of the conductive wire winding on the middle section of the test probe, a length $L_2$ of a part of the middle section of the test probe wound by the conductive wire and an outer diameter $D_1$ of the insulation layer at the middle section of the test probe are in a relation of:

$$L_1 \geq L_2 + 3.14 D_1.$$

2. The probe card assembly as claimed in claim 1, wherein the test probe whose middle section is wound, on the outer surface thereof, by the at least one conductive wire is the power probe.

3. The probe card assembly as claimed in claim 1, wherein the test probe whose middle section is wound, on the outer surface thereof, by the at least one conductive wire is one of the signal probes.

4. The probe card assembly as claimed in claim 3, wherein the test probe whose middle section is wound, on the outer surface thereof, by the at least one conductive wire is a high-frequency signal test probe.

5. The probe card assembly as claimed in claim 1, wherein pitches between circles formed by the conductive wire winding on the test probe are identical.

6. The probe card assembly as claimed in claim 1, wherein pitches between circles formed by the conductive wire winding on the test probe are different.

7. A probe card assembly, comprising a main body, a probe base provided at a center of the main body, and a plurality of test probes connecting the main body and the probe base, wherein each of the test probes has a tip extending out from the probe base for contacting a wafer to be tested, and the test probes comprise at least one power probe, at least one grounding probe and a plurality of signal probes, in which each of the test probes has a middle section between the main body and the probe base and contains therein a core that is wrapped by an insulation layer, the probe card assembly being characterized in that:

at least one of the test probes other than the grounding probe has an outer surface of the middle section thereof wound by at least one conductive wire whose two ends are connected to a grounding end of the main body of the probe card assembly, wherein a diameter $D_2$ of circles formed by the conductive wire winding on the test probe, a diameter $D_3$ of the core of the test probe and a characteristic impedance E of the test probe are in a relation of:

$$20 * D_2/D_3 \leq E \leq 25 * D_2/D_3.$$

8. The probe card assembly as claimed in claim 7, wherein the test probe whose middle section is wound, on the outer surface thereof, by the at least one conductive wire is the power probe.

9. The probe card assembly as claimed in claim 7, wherein the test probe whose middle section is wound, on the outer surface thereof, by the at least one conductive wire is one of the signal probes.

10. The probe card assembly as claimed in claim 9, wherein the test probe whose middle section is wound, on the outer surface thereof, by the at least one conductive wire is a high-frequency signal test probe.

11. The probe card assembly as claimed in claim 7, wherein the characteristic impedance E of the test probe is about 50 ohm when $D_2/D_3 = 2.2$.

12. A test probe for use in a probe card assembly, said probe card assembly comprising a main body, a probe base provided at a center of the main body, and plural said test probes connecting the main body and the probe base, wherein each of the test probes has a tip extending out from the probe base for contacting a wafer to be tested, in which each of the test probes has a middle section between the main body and the probe base and contains therein a core that is wrapped by an insulation layer, the test probe being characterized in that:

the test probe has an outer surface of the middle section thereof wound by at least one conductive wire whose two ends are connected to a grounding end of the main body of the probe card assembly, wherein a length $L_1$ of the conductive wire winding on the middle section of the test probe, a length $L_2$ of a part of the middle section of the test probe wound by the conductive wire and an outer diameter $D_1$ of the insulation layer at the middle section of the test probe are in a relation of:

$$L_1 \geq L_2 + 3.14 D_1.$$

13. The test probe as claimed in claim 12, wherein the test probe is the power probe.

14. The test probe as claimed in claim 12, wherein the test probe is the signal probe.

15. The test probe as claimed in claim 14, wherein the test probe is a high-frequency signal test probe.

16. A test probe for use in a probe card assembly, said probe card assembly comprising a main body, a probe base provided at a center of the main body, and plural said test probes connecting the main body and the probe base, in which each of the test probes has a middle section between the main body and the probe base and contains therein a core that is wrapped by an insulation layer, the test probe being characterized in that:

the test probe has an outer surface of the middle section thereof wound by at least one conductive wire whose two ends are connected to a grounding end of the main body of the probe card assembly, wherein a diameter $D_2$ of circles formed by the conductive wire winding on the test probe, a diameter $D_3$ of the core of the test probe and a characteristic impedance E of the test probe are in a relation of:

$$20 * D_2/D_3 \leq E \leq 25 * D_2/D_3.$$

17. The test probe as claimed in claim 16, wherein the test probe is the power probe.

18. The test probe as claimed in claim 16, wherein the test probe is the signal probe.

19. The test probe as claimed in claim 18, wherein the test probe is a high-frequency signal test probe.

* * * * *